United States Patent [19]

Mathiesen

[11] 3,787,835

[45] Jan. 22, 1974

[54] CONVERTER FOR GYRO-COMPASS DIGITAL DISPLAY

[75] Inventor: Odd Mathiesen, Oslo, Norway

[73] Assignee: International Standard Electric Corporation, New York, N.Y.

[22] Filed: May 5, 1972

[21] Appl. No.: 250,517

[30] Foreign Application Priority Data

May 7, 1971 Norway .............................. 1731/71

[52] U.S. Cl. ..................... 340/347 SY, 340/347 AD

[51] Int. Cl. .......................................... H03k 13/02

[58] Field of Search 340/347 SY, 347 AD, 195, 198, 340/203; 318/654–660

[56] References Cited

UNITED STATES PATENTS

| | | | |
|---|---|---|---|
| 3,533,097 | 10/1970 | Sleven | 340/347 SY |
| 3,028,589 | 4/1962 | Broadwell | 340/347 SY |
| 3,573,801 | 4/1971 | Cohen et al. | 340/347 SY |
| 3,440,644 | 4/1969 | Burgis et al. | 340/347 SY |

*Primary Examiner*—Charles D. Miller
*Attorney, Agent, or Firm*—W. T. O'Neil

[57] ABSTRACT

A gyro-compass (synchro) analog output data encoder system for open-loop control of a digital bearing angle indicator in degrees and decimal parts of degrees. Applicable, in general, to digital presentation of shaft angle changes at a remote location.

3 Claims, 9 Drawing Figures

CONVERTER FOR GYRO-COMPASS DIGITAL DISPLAY

CROSS-REFERENCES TO RELATED APPLICATIONS

This application is filed under the provisions of 35 U.S.C. 119 with claim for the benefit of the filing of an application covering the same invention filed May 7, 1971, Ser. No. 1731/71, in Norway.

BACKGROUND OF THE INVENTION

1. Field of the Invention

The invention relates generally to remote repeaters of shaft position data and more specifically to decimal digital presentation of gyrocompass readings originating in three wire "synchro" data form.

2. Description of the Prior Art

In the prior art, the so-called "synchro" is well known as a shaft motion repeater device. These devices have also been known by the name "selsyn." Gyrocompass systems on ships require that the data generated by the compass device itself be remoted to the bridge and elsewhere, so systems for accomplishing this have long been known in various forms.

Concerning the actual electrical system by which compass derived data is originated, it is well known to use a transducer of the synchro type or a step-by-step switch and follow-up motor. In many currently employed arrangements, the pick-off transducer is of one of two general types. Hereinafter, the references to "gyro" or gyro data will be understood to refer to a three wire transducer output arrangement having 120° phase (in terms of shaft angle) spacing of the modulation envelopes of the three corresponding signals. A common AC carrier (such as 50 or 60Hz) is modulated by the transducer to form the three signals on the three output leads.

The word "gyro" will also be understood to infer the "synchro" type of transducer producing the aforementioned three wire signal set. These "synchro" or "gyro" devices, as they are hereinafter referred to, are generally of the sinusoidal or square wave envelope type, as will be apparent from FIGS. 1*a* and 1*b*, when these are discussed hereinafter. It should be realized that the abscissae of these figures are not time coordinates, but rather represent angular values.

As the gyro rotates 360°, the displacement between signal envelopes maintains the aforementioned 120° relationship. It is also well known to introduce a gear step-up arrangement between the actual compass element and the gyro transducer generating the three wire electrical signal set aforementioned. Thereby, greater accuracy is achieved. In the present system, the gear ratio might be, for example, 1:360, whereby one degree of course change produces 360° of rotation of the gyro (transducer) or signal transmitter.

In the prior art, repeater (synchro motor) elements have often been used to respond in a direct connected analog arrangement. In the FIG. 1a form, the repeater is very similar to a transmitter unit.

The same principle is used in a slightly different form when the signals for another type of gyro transmitter have the form shown of FIG. 1*b*. Here the signals are D C levels which change abruptly at 120° intervals by commutation or switching at the transmitter. The conventional receiver for such signals may have the same design, with field coils and rotor, as the repeater mentioned above, the only difference being that the repeater motor will be moved in steps. The general operating principle will, however, be identical in the two cases.

Both of these known systems give analog output at the repeater and both of them are sensitive to short noise pulses and other inaccuracies which deteriorate the accuracy. Short noise pulses may even introduce a faulty addition to the following information, since, in general, these devices operate "open loop."

SUMMARY OF THE INVENTION

In accordance with the hereinbefore referenced state of the prior art, it may be said to be the general object of the present invention to provide an improved gyro data repeater in the form of a decimal digital display and associated circuitry which is compatible with various existing gyro units and which provides improved noise immunity and therefore, improved accuracy in open-loop operation.

Each of the three gyro signals (G1, G2 and G3) is amplified and limited, discretely, to produce a series of pulses at the carrier frequency. Next, pairs of limited pulses, i.e., G1 + G2, G2 + G3, and G1 + G3 are formed by summation, each sum signal containing one or more pulses at regular intervals angularly. The pulses in each sum signal are shifted in angular phase compared to the pulses of the other two. By temporarily storing these pulses in a logic circuit, the next of the three signal lines to produce a pulse is employed in a logic circuit to determine the sense of the angular change. A converter circuit to put the correction increments into tenths of a degree is included, as is an "interlock" circuit to prevent extraneous registrations. The flip-flops of that logical "interlock" do not switch on any pulse shorter in duration than a predetermined time.

DESCRIPTION OF THE PREFERRED EMBODIMENTS

Figure 1A:
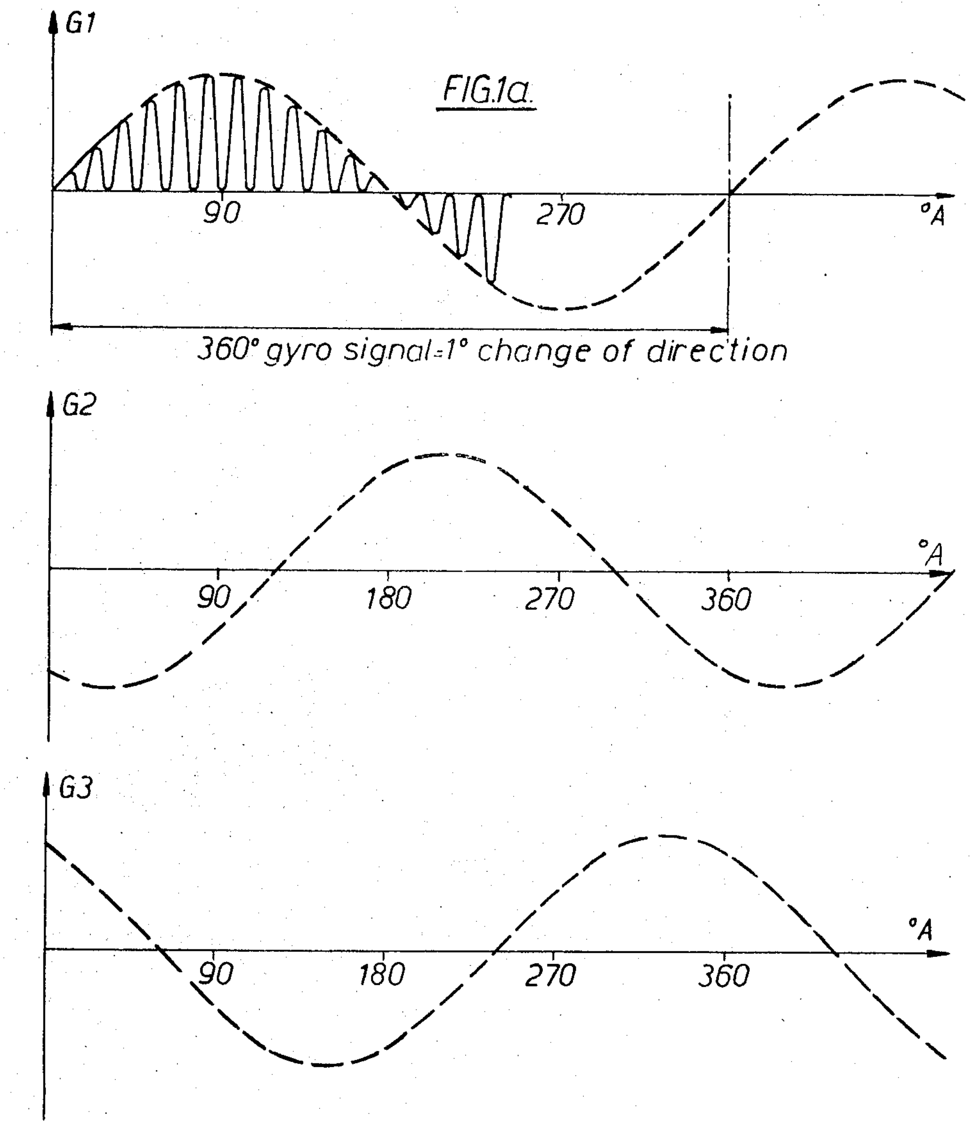
FIG. 1*a* shows an example of the output signal from one type of gyro.

Referring now to FIG. 1*a*, one of the most common output signal patterns from a gyro is shown. The axes G1, G2 and G3 represent the momentary voltage and axis A represents the course (angle of a gyro transducer shaft) as given by the gryo compass (or any other angular detector). These three signals are applied to separate lines and when the course changes, the amplitude of all three signals will vary accordingly.

The carrier signal from the gyro is a common AC type, for example, a 50 or 60 Hz AC voltage as partly shown within the envelope lines. The carrier signal will undergo a phase shift of 180° when the envelope makes a zero crossing. The three discrete signals, G1, G2 and G3 may be thought of as separately modulated by the gyro transducer, in accordance with well known prior art.

Figure 1B:
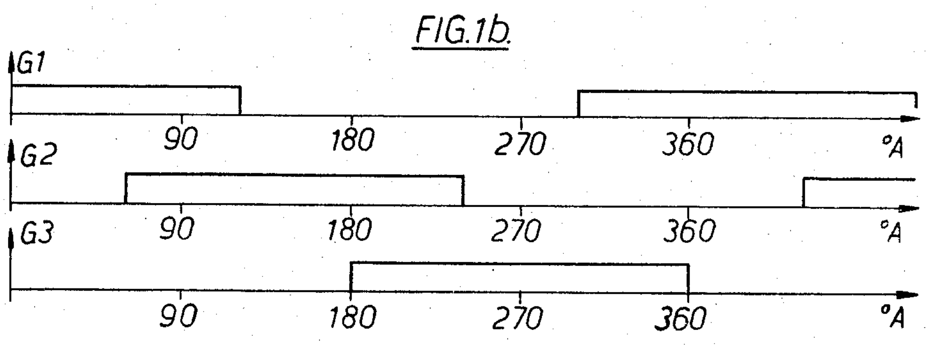
FIG. 1*b* shows an example of the output signal from another type gyro.
Figure 1F:
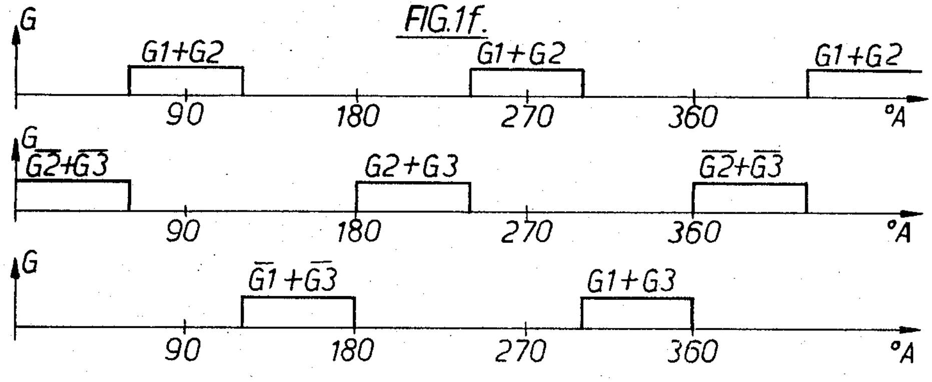
FIG. 1f shows the result obtained when pairs of pulses from FIGS. 1*b* and 1*e* are added.

In FIG. 1*b* another of the prior art gyro output signal formats is illustrated. Here the signals are DC levels which change abruptly at certain intervals when the course (gyro angle) changes as shown in the figure. The circuitry of the present invention as disclosed in the following description will accept both of these types of known signals. FIGS. 1*c*–1*f* will be referred to in connection with the following description of the system of the invention.

Figure 2:
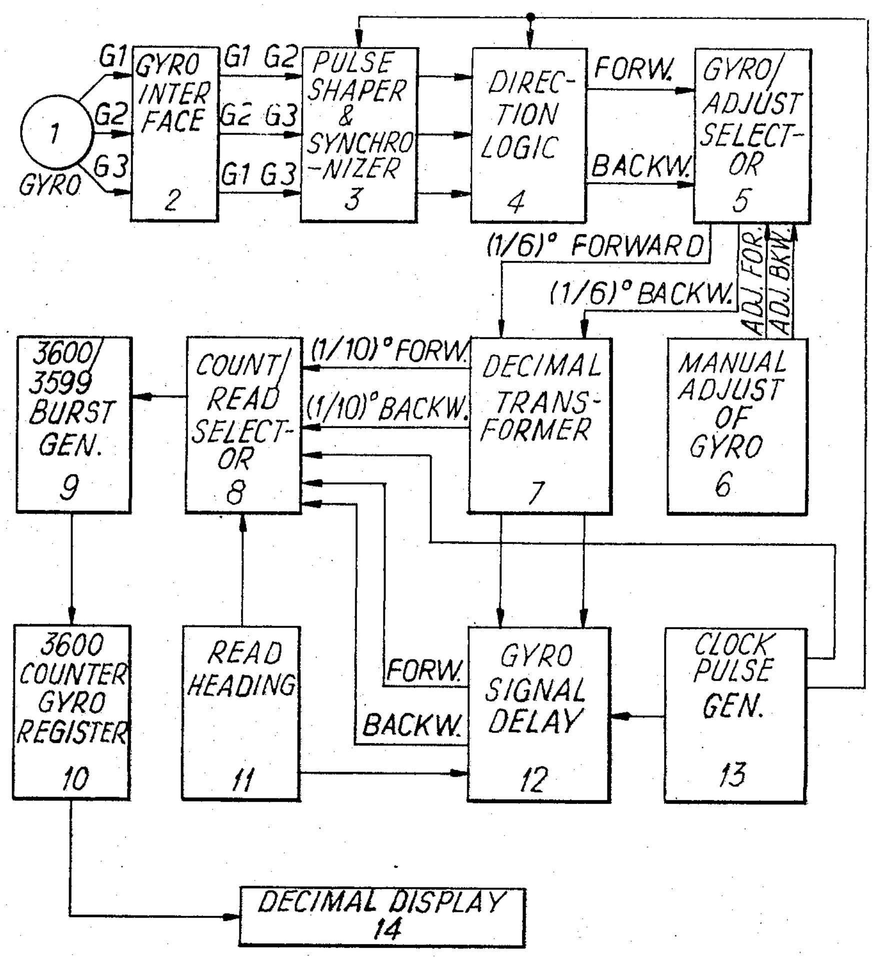
FIG. 2 shows a block diagram of the system of the invention.

Referring now to FIG. 2, the block diagram of a typical circuit is shown. Here G1, G2 and G3 represent the three outputs signals (of either type aforementioned) from the gyro 1. In the gyro interface circuit 2, these signals are amplified, limited and then added to sum pairs (i.e., G1 + G2, G2 + G3, etc.), as will be seen in FIG. 2. The output signals from interface unit 2 thus comprise three signals which represent the addition of signals from FIG. 1*d* or 1*f*, depending on whether the basic inputs were in accordance with FIG. 1*a* or 1*b*, respectively. The corresponding form of the signals prior to the addition operation in unit 2 is in accordance with FIG. 1*c*, i.e., when they are amplified and limited but not yet added. The summed signals are lead next to the signal synchronizer and pulse shaping circuit 3 from 2, here a clock pulse from a clock generator 13 is used to obtain synchronized pulses, inverted and shaped for application to logic circuit 4 in which it is determined whether the course change is in the positive or the negative angular sense. That determination may be undertaken by means of a pair of flip-flops which give four different output combinations. Three of these combinations are used to designate the correspondingly output channels. One of the combinations thus represent a mark value in each of the channels respectively. When a zero-crossing occurs in one of the channels, therefore a signal is produced in only one particular one of the three signal lines and thus establishing the direction or angular sense of the course change. The circuit 4 will be explained in more detail hereinafter.

The direction logic output 4, comprises two leads which provide signals representative of forward rotation in one, and backward in the other (increasing or decreasing angular value). A gyro signal/manual adjust signal selector 5 receives the two direction logic leads from 4 and if no manual adjust signal is extant there, those signals are passed to the decimal transformer 7. There will thus be a pulse on the forward, or backward line to the decimal transformer 7 each time the gyro makes a step of 1/6°. If there is no output signal from the heading read circuit 11, the output from the decimal converter will be lead to the count/read selector 8 which determines whether a read process is undertaken at this moment or not. If not, the counting decimal pulse will be directed via the burst generator 9 to the register 10 and then to the display unit 14.

If the system has been out of use for a time, the register will not be updated and it will be necessary to undertake a manual adjustment of the register's content. For that purpose, the gyro information obtained directly from the gyro itself may be manually placed into the register by circuit 6. When this manually controlled adjustment is finished, the register will automatically add the single forward pulses, respectively subtract the single backward pulses which are received via the count/read selector 8, and will thus automatically keep the content of the register updated.

If there, however, does exist an output pulse from the read heading circuit 11 to the count/read selector 8, this indicates that decimal angular information cannot be received by the register 10 at the moment. The decimal angular information which may be received at that time is therefore transmitted from the decimal transformer 7 to the gyro signal delay device 12. In this delay device, the decimal angular information is delayed to an extent that when it thereafter, via the count/read selector 7, is presented to the 3,600/3,599 burst generator 9, the read out process is finished and the register therefore is capable of receiving the presented information which appears on the decimal transformer. Thus no information pulses will be lost during a read out process. Various forms of known instrumentation, such as continuous magnetic tape, etc., can provide that delay.

Many of the blocks in this block diagram may be conventially instrumented and do not represent of themselves, a part of the novelty, although included in the novel combination. Those skilled in this art will recognize the design requirements from the functional descriptions. More detailed description of certain of the blocks of FIG. 2, as appropriate, follows.

Figure 1C:
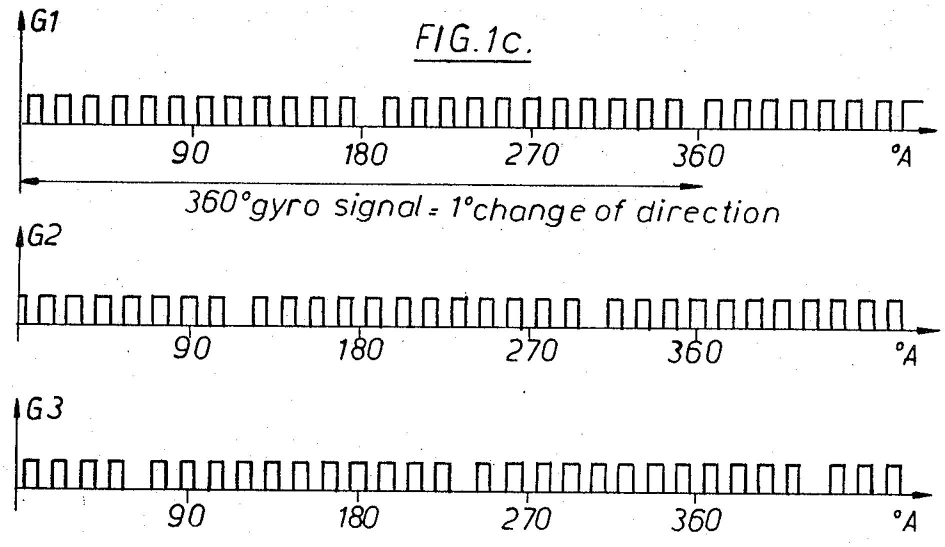
FIG. 1*c* shows the pulses obtained when the gyro signals according to FIG. 1*a* are amplified and limited.
Figure 3:
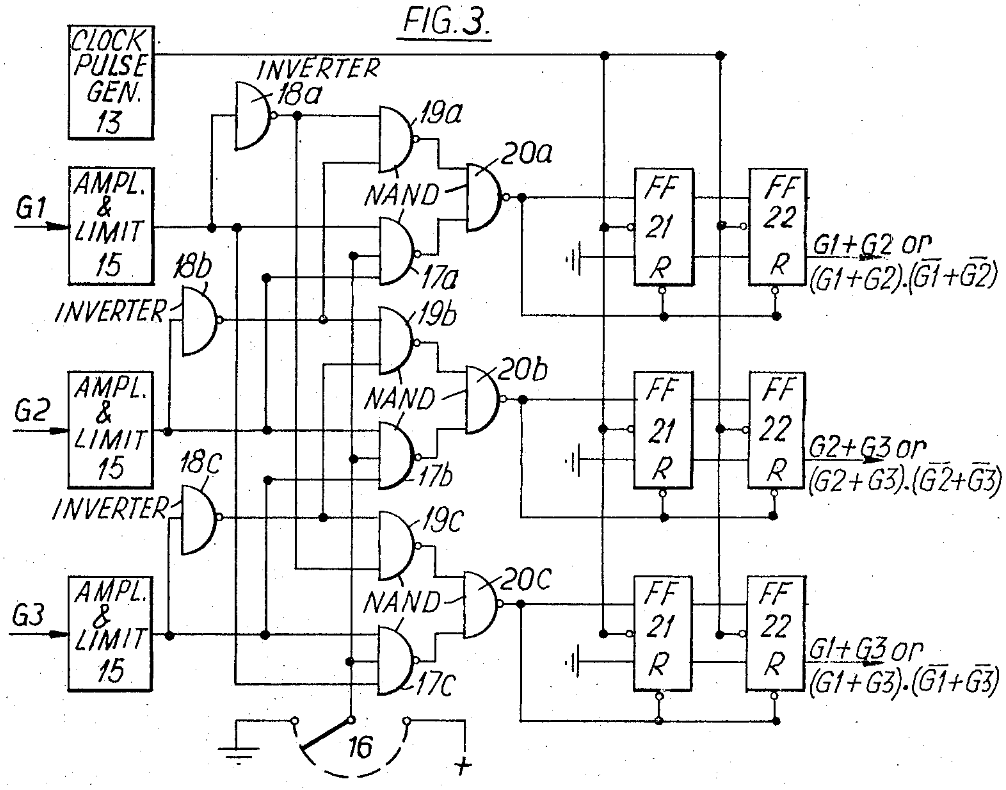
FIG. 3 shows a detailed logical diagram of an embodiment of the circuit included in block 2 in FIG. 2.

In FIG. 3, a circuit for instrumenting block 2 is shown. The circuit always provides sum signals which have six pulses or pulse sets per degree of direction change, whether the output from the gyro is of the type in accordance with FIG. 1*a* or as in 1*b*. To operate with FIG. 1*a* signals, the switch 16 (FIG. 3) should be connected to ground side. The NAND gates 17*a*, *b* and *c*, will then be closed. Consequently, on the three outputs from the circuit of FIG. 3, the signals G1 + G2, G2 + G3 and respectively G1 + G3 will appear. From FIG. 1, prior and subsequent treatment of those signals then will be understood. On the FIG. 3 input we assume the raw signals shown in FIG. 1 are extant. When these signals are amplified and limited in their respective circuits 15*a*, *b* and *c*, signals as shown in FIG. 1*c* are obtained. On the outputs from the adding circuit which involve the inverters 18*a*, *b* and *c*, and the NAND gates 19*a*, *b*, and *c*, 20*a*, *b* and *c*, and the flip-flops 21,22*a*, *b* and *c*, there will appear signals as illustrated in FIG. 1*d*.

If the signals on the input, however, are of the DC block type illustrated in FIG. 1*b*, the switch 16 is switched to the + side. This allows not only the input signals themselves, but also the inverted input signals to be added. This is shown in detail in FIGS. 1*b*, 1*e* and finally in FIG. 1*f*. From the last figure we will see that also, in this case, are obtained six different pulses for an angular change of 1° when all the three lines (outputs) are considered.

Figure 1D:
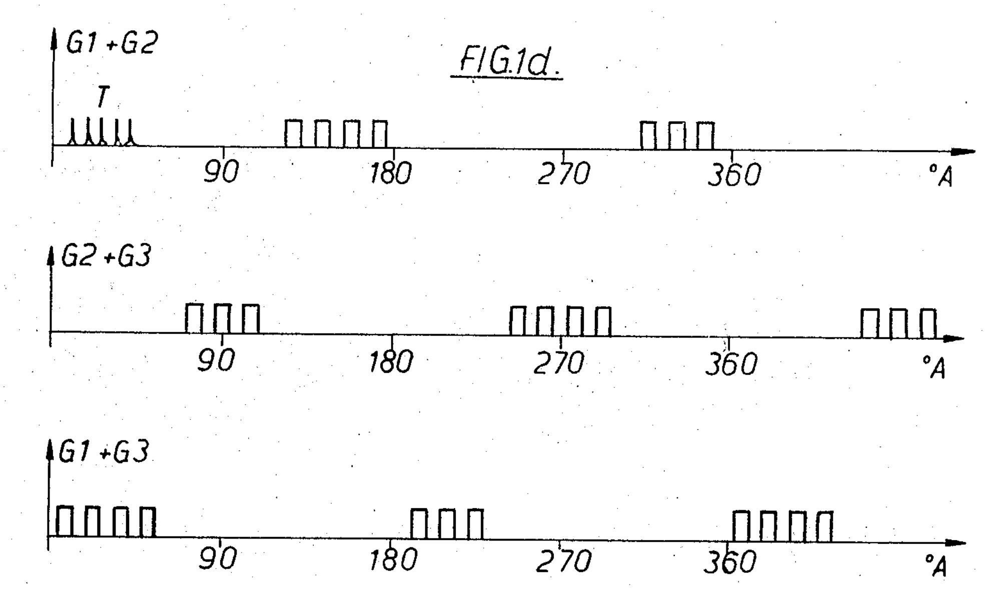
FIG. 1*d* shows the result obtained when pairs of the pulses shown in diagram 1*c* are added.
Figure 1E:
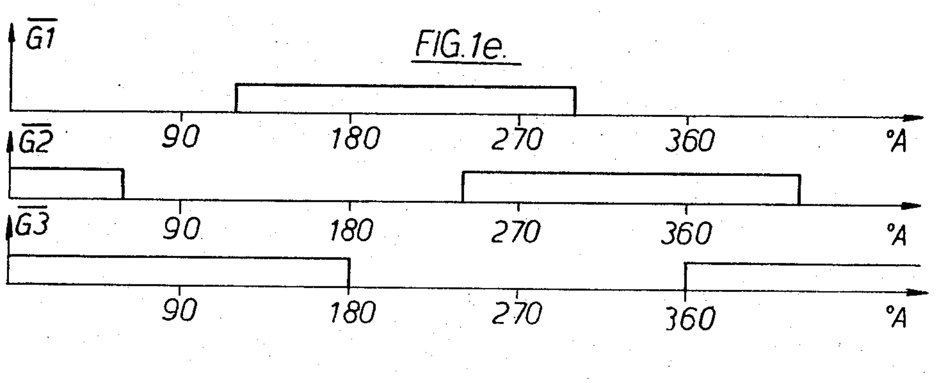
FIG. 1*e* shows the pulses of FIG. 1*b*, inverted.

The signals which are obtained on the outputs from the NAND gates 20*a*, *b* and *c*, may however, include transients as indicated by the short pulses T on FIG. 1*d*. It is necessary to avoid or suppress such transients as they may introduce a faulty operation of the equipment.

These transients, and signal distortion in general, as may be introduced in the system, will be effectively removed by the flip-flops 21*a*, *b* and *c*, and 22*a*, *b* and *c* of FIG. 3. This is because the second flip-flop (22 set) in each line will be switched on only if the input signal has a longer duration than the delay time introduced by the first flip-flop (21 set). That delay time is determined by the clock pulse frequency of the pulses from generator 13.

Figure 4:
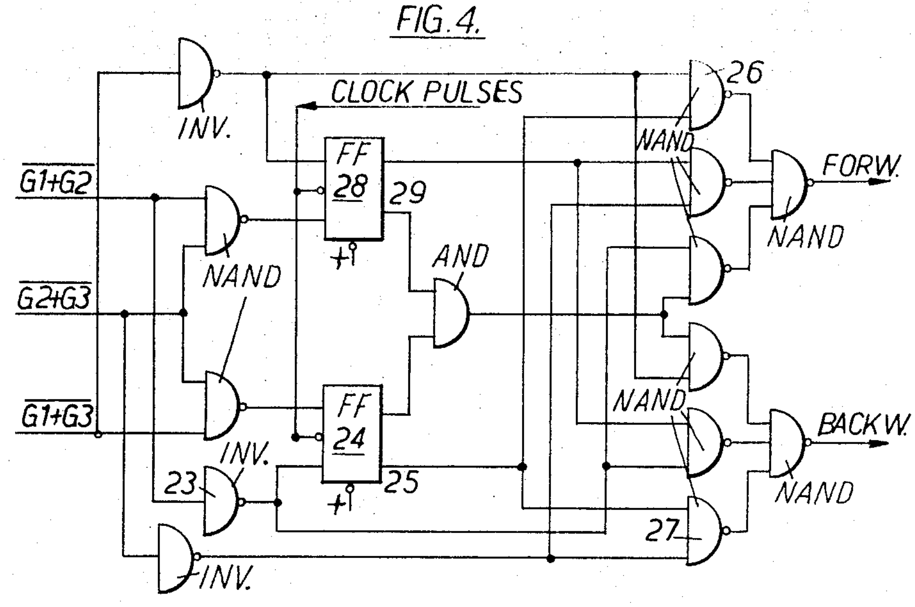
FIG. 4 shows a logical circuit of an instrumentation for block 4 of FIG. 2.

An embodiment of the "direction logic" (block 4) will now be described from FIG. 4.

The input signals to the circuit 4 are all in inverted form from the pulse shaper and synchronizer 3.

If the last pulse introduced to circuit 4 was $\overline{G1+G2}$ this pulse then, via the inverter 23, will have switched the flip-flop 24 and flip-flop 28 to their "lower states," i.e., with a digital "1" on the outputs 25 and 29. This pulse will then enable the NAND gates 26 and 27 and keep them enabled until the next pulse appears on one of the inputs to switch the flip-flop again. If this next pulse also appears on the input $\overline{G1+G2}$ no action follows. That occurrence indicates that there has not been any angular change equal to or greater than the smallest detectable value (1/6°). If, however, the next pulse occurs on the input $\overline{G2+G3}$ this pulse will pass straight through the already enabled NAND-gate 27 and thus indicate a rotation in backward direction. If, on the other hand, the next pulse instead occurred on the input $\overline{G1+G3}$, this would instead open the enabled gate 26, and thus give an output pulse in forward direction. This also is in accordance with the FIGS. 1*d* and 1*f* from which it is seen that a displacement from pulse G1 + G2 to G2 + G3 will give a displacement toward a smaller angular value and thus represents a "backward" counting. The circuit of FIG. 4 will thus store the previous input signal and when the subsequent input signal is received, the previous one will control the gating process according to which a "forward" or a "backward" output signal is obtained.

The output signals from the "direction logic" however, still concern angular steps of 1/6° when a conventional gyro output is considered.

The present invention also includes a simple method for converting this 1/6° information into decimal information in circuit 7. That converting process is undertaken in the following manner:

Direction pulses from the "direction logic" circuit are applied to a bidirectional counter (not shown) with three steps. When this counter makes its first step in the forward direction this causes an output which is transformed to one single pulse on a "forward" decimal output. The two next steps which the counter makes in forward direction are, however, each transformed to two pulses on the "forward" decimal output. If then three backward steps are taken, the process will go in the opposite direction, i.e., the two first backward steps are each converted into two pulses on the backward decimal output, while the last of the three backward steps will result in a single pulse on the backward decimal output. When the counter steps in only one direction, the decimal output thus will give a sequence containing 1-2-2-1-2-2-1 etc. pulses. The corresponding angular values are given in the table below:

| Counter step | Exact corresponding angular change | Corresponding decimal output |
|---|---|---|
| 1 | 1/6°=0.166° | 2 pulses=0.2°. |
| 2 | 2/6°=0.333° | +1 pulse=0.3°. |
| 3 | 3/6°=0.5° | +2 pulses=0.5°. |
| 4 | 4/6°=0.666° | +2 pulses=0.7°. |
| 5 | 5/6°=0.833° | +1 pulse=0.8°. |
| 6 | 6/6°=1.000° | +2 pulses=1.0°. |

It should be noted that the maximal angular error which will be produced by this very simple conversion is ± 0.033°. Such a small error is quite negligible in a gyro system.

The output pulses from the decimal transformer 7 are provided to the gyro memory (register) 10 via the count/read selector 12 and this transfer serves to update the content in this memory automatically. If the decimal pulse appears on the forward output this means that the number of degrees is increased and that the pulses are then simply added to the content in the memory (register).

For reasons of economy, it is preferred to use a counter in the register which only can count in one direction, here called the forward direction. It is, however, necessary to have a register which can also count in the negative or backward direction. To this end, there is, in addition to the counter in the memory, also a further counter with the same number of steps as the first mentioned counter. The latter is located in the burst generator 9. This burst generator is then used both when it is desired to make a backward count in the register and also when it is desired to read out the content in the register in a non-desctructive manner. Each time it is desired to make a backward step of the register, this is accomplished by means of simple logic circuits which operates the burst generator in such a manner that it applies one pulse less than the complete number of steps in the counter to the register. If the counter in the register has 3,600 steps, as may be the case when it stores gyro information to the 1/10° granuality, then each time this counter is required to take a step in the backward direction it actually takes 3,599 steps in the forward direction.

When the content of the register is read out in a non-destructive manner, the burst generator again operates providing another function. This time it causes a forward count of 3,600 steps (a complete counting cycle) in the register. When this complete counting cycle is carried out, the content of the register will be the same as before the reading out process. Accordingly, a gating network connected to the output of the register provides a number of pulses corresponding to the content of the register to display device 14.

It will be apparent to the skilled reader that various modifications and substitutions may be made within the scope of this invention, once its generic concepts are understood. Accordingly, it is not intended that the scope of the invention be limited by this description and the drawings, these being illustrative only.

What is claimed is:

1. A signal converter responsive to a three-wire analog gyro data set for generating forward and backward pulses to control a digital display representative of angular displacements of a gyro transmitter, comprising:

means for amplifying and limiting the signals of said data set discretely to form a corresponding set comprising first, second and third initial pulse trains of substantially uniform amplitude;

means responsive to said sets of initial pulse trains for producing a set of summed pulse trains, including a first summed pulse train obtained by addition of said first and second initial pulse trains, a second summed pulse train obtained by addition of said second and third initial pulse trains, and a third summed pulse train obtained by addition of said first and third initial pulse trains, said summed pulse trains each thereby containing at least one pulse at each of a plurality of predetermined angular intervals, said pulses in each of said summed pulse trains being shifted in angular phase with respect to pulses in the other two summed pulse trains;

direction logic means for storing at least the one of said summed pulse trains in which the most recent angle interval pulse occurred, and for generating a forward controlling pulse whenever a next pulse in time occurs in another of said summed pulse trains corresponding to increasing angular sense, and for generating a backward controlling pulse whenever a next pulse in time occurs in another of said summed pulse trains corresponding to decreasing angular sense, said controlling pulse generation being effected each time with reference to the one of said summed pulse trains containing said last occurring pulse.

2. Apparatus according to claim 1 in which said direction logic means includes a tandem, two flip-flop circuit for each of said summed pulse trains, and clock pulse means, said flip-flops each being responsive to said clock pulses and, in tandem pairs, to the corresponding one of said summed pulse trains, such that only signals in said pulse trains in excess of a predetermined duration in cooperation with said clock pulses are able to produce switching of any of said flip-flop to output a signal representative of any of said summed pulse trains.

3. Apparatus according to claim 2 in which each of said summed pulse trains contains two pulses per degree of angular change of said gyro transmitter, said pulses being shifted in angular significance among said summed pulse trains in such a way that one pulse on a line corresponding to any of said summed trains is generated for each 1/6° angular change of said gyro transmitter.

* * * * *